United States Patent [19]

Aoki et al.

[11] 4,392,158

[45] Jul. 5, 1983

[54] INTERLACED SOLID-STATE IMAGING DEVICE

[75] Inventors: Masakazu Aoki, Kodaira; Haruhisa Ando, Hachioji; Shinya Ohba; Shoji Hanamura, both of Kokubunji; Iwao Takemoto, Hinodemachi; Ryuichi Izawa, Kokubunji, all of Japan

[73] Assignee: Hitachi, Ltd., Tokyo, Japan

[21] Appl. No.: 257,461

[22] Filed: Apr. 24, 1981

[30] Foreign Application Priority Data

Apr. 25, 1980 [JP] Japan .................................. 55-54158

[51] Int. Cl.³ ............................................. H04N 3/14
[52] U.S. Cl. .................................................. 358/213
[58] Field of Search ....................... 358/212, 213, 184; 250/211 J, 211 R, 553; 357/24, 45; 307/221 D

[56] References Cited

U.S. PATENT DOCUMENTS

| 4,001,501 | 1/1977 | Weimer | 358/213 X |
| 4,155,006 | 5/1979 | Sato et al. | 358/213 X |
| 4,212,034 | 7/1980 | Kokie et al. | 358/213 |

*Primary Examiner*—Robert L. Richardson
*Attorney, Agent, or Firm*—Antonelli, Terry & Wands

[57] ABSTRACT

In a solid-state imaging device having a plurality of photodiodes which are arrayed in two dimensions on an identical semiconductor body, a group of horizontal switching elements and a group of vertical switching elements which pick up the photodiodes, and a horizontal scanning circuit and a vertical scanning circuit which impress scanning pulses on the horizontal and vertical switching elements respectively, and having an interlaced scanning mechanism which picks up a plurality of vertical scanning lines by means of interlace switching elements so as to permit horizontal scanning of scanning lines of a plurality of rows; a solid-state imaging device characterized in that said interlaced scanning mechanism includes insulated-gate field effect transistors for recovering voltage levels of the scanning pulses having undergone voltage drops due to the interlace switching elements.

7 Claims, 5 Drawing Figures

INTERLACED SOLID-STATE IMAGING DEVICE

BACKGROUND OF THE INVENTION

This invention relates to a solid-state imaging device, and more particularly to an enhancement in the dynamic range of the solid-state imaging device.

FIG. 1 shows a typical example of a prior-art solid-state imaging device (hereinbelow, termed "photosensor"). It illustrates the fundamental circuit arrangement of a MOS-type photosensor in which picture elements employing insulated-gate field effect transistors (hereinbelow, termed "MOSTs") as vertical switching elements and employing the source junctions of the MOSTs as photodiodes are arrayed in the form of a matrix. In the figure, numeral 1 designates a shift register which serves as a horizontal scanning circuit, numeral 2 a shift register which serves as a vertical scanning circuit, numeral 3 an interlace circuit, numeral 4 a vertical scanning line (vertical gate line) for addressing in the Y direction, numeral 5 a photogate which serves as a vertical switching element, numeral 6 a photodiode, numeral 7 a vertical signal output line, numeral 8 a horizontal switching element for executing sequential addressing in the X direction with an output from the horizontal shift register 1, numeral 10 a horizontal signal output line, numeral 11 an output terminal, and numeral 12 a region of a photodiode array.

FIG. 2 shows a concrete example of the interlace circuit indicated at 3 in FIG. 1. In the figure, numeral 21 designates the vertical shift register, numeral 22 the interlace circuit, and numeral 23 the region of the photodiode array. The operation of the circuitry in FIG. 2 will be described. For example, in case where a field pulse $F_1$ enters a terminal 24, the delivery of an output pulse from the vertical shift register 21 to an output line 26 results in that vertical gate lines 28 and 29 are simultaneously picked up in response thereto. When an output pulse is subsequently delivered to an output line 27, vertical gate lines 30 and 31 are simultaneously picked up. On the other hand, in case where a field pulse $F_2$ enters a terminal 25, pairs of vertical gate lines which are picked up in response to the output pulses from the vertical shift register 21 to the output lines 26 and 27 are a set of the lines 29 and 30 and a set of lines 31 and 32, respectively. That is, the set of the vertical gate lines to be picked up is shifted by the change-over of the field pulses, whereby the interlacing is permitted.

The photosensor of the circuit arrangement as shown in FIGS. 1 and 2 encounters the difficult problem of the reduction of a dynamic range when it is intended to realize a photosensor of high packaging density which has a comparatively small size enough to be fabricated on the mass-production basis and a number of picture elements enough to attain a resolution of practical level. The packaging density of the photosensor as stated above exceeds the scale of a device being presently developed as a VLSI (Very Large Scale Integration), requires the fine patterning technology and results in inevitably lowering a supply voltage in relation to the device breakdown and reliability. This point is discussed in detail in, for example, H. Masuda et al., "Characteristics and Limitation of Scaled Down MOSFET's Due to Two-Dimensional Field Effect", IEEE Trans., Electron Devices, ED-26, 6, p. 980, June 1979.

In the photosensor of the circuit arrangement shown in FIGS. 1 and 2, interlace switches formed of MOSTs 201 are employed in the interlace circuit portion, and hence, voltage drops based on a threshold voltage $V_T$ are unavoidably caused. Even if a voltage kept intact at a supply voltage $V_{DD}$ is fed from the vertical shift register, only a voltage $(V_{DD}-V_T)$ will be applied to the vertical gate lines. In this case, the threshold voltage $V_T$ often has a great value on account of the substrate effect, and it is not uncommon that $(V_{DD}-V_T)$ is smaller than $V_{DD}$ as much as 20–30%. Further, the dynamic range of the photosensor is given by $(V_{DD}V_T-V_T')$ where $V_T'$ denotes the threshold voltage of the photogate 5. Therefore, the reduction of the dynamic range due to the threshold voltages becomes as much as near 50% of the supply voltage $V_{DD}$, to incur the serious problem that the dynamic range becomes much lower than the supply voltage $V_{DD}$ which is low in itself as described before. For example, in case where the supply voltage $V_{DD}$ is made 5 V used in a recent high-packaged MOSLSI, the dynamic range becomes less than approximately 1.5 V on the supposition that $V_T \sim 2.0$ V and $V_T' \sim 1.5$ V ($V_T$ and $V_T'$ become great on account of the presence of the substrate effect). This is not practical in that, at a high contrast scene, the while level is limited to render a reproduced image unsightly in actuality.

SUMMARY OF THE INVENTION

This invention has been made in order to improve the problem of the prior-art photosensor, and has for its object to provide a photosensor of wide dynamic range.

That is, the object of this invention is to provide a photosensor which can supply a predetermined driving voltage to vertical gate lines.

In order to accomplish the object, according to a photosensor of this invention, a buffer circuit is disposed between an interlace circuit and a photodiode array, and the high level voltage of a vertical driving pulse having undergone a voltage drop in the interlace circuit is recovered by the buffer circuit.

DESCRIPTION OF THE PREFERRED EMBODIMENTS

Hereunder, this invention will be described in detail in conjunction with embodiments.

Figure 1:
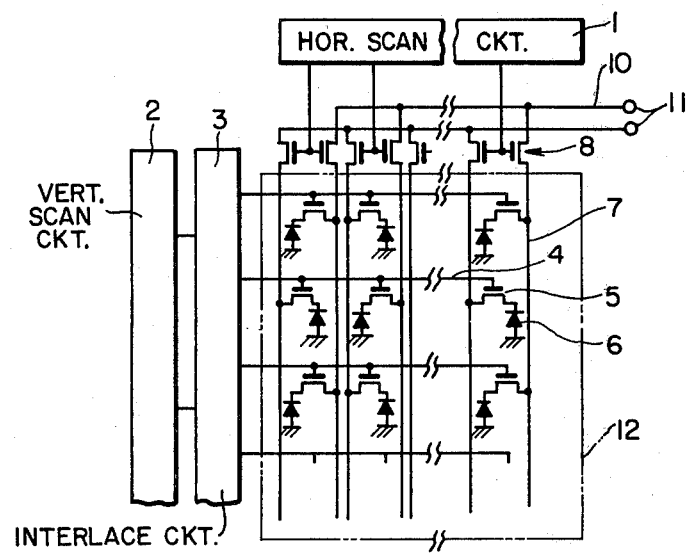
FIG. 1 is a schematic circuit diagram showing the construction of a prior-art, MOS type solid-state imaging device.
Figure 2:
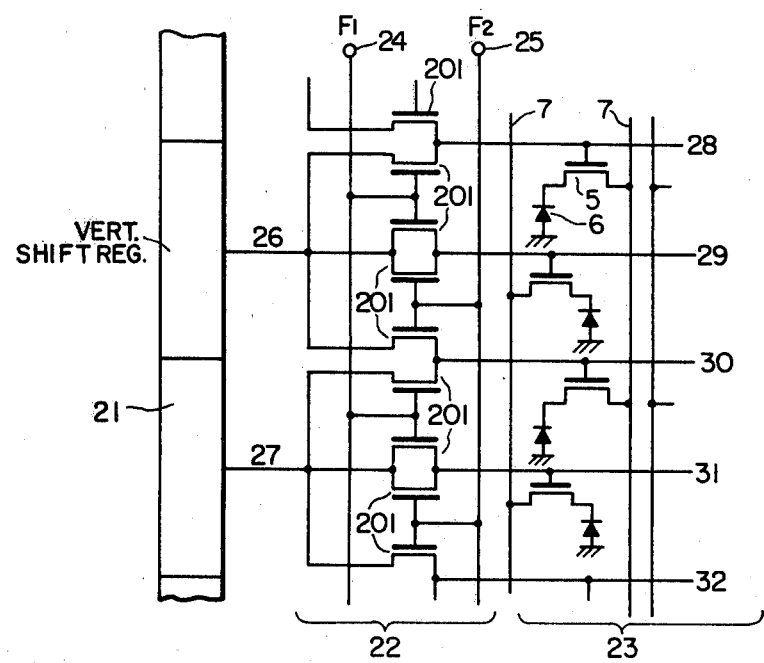
FIG. 2 is a schematic circuit diagram showing an example of an interlace circuit in FIG. 1.
Figure 3:
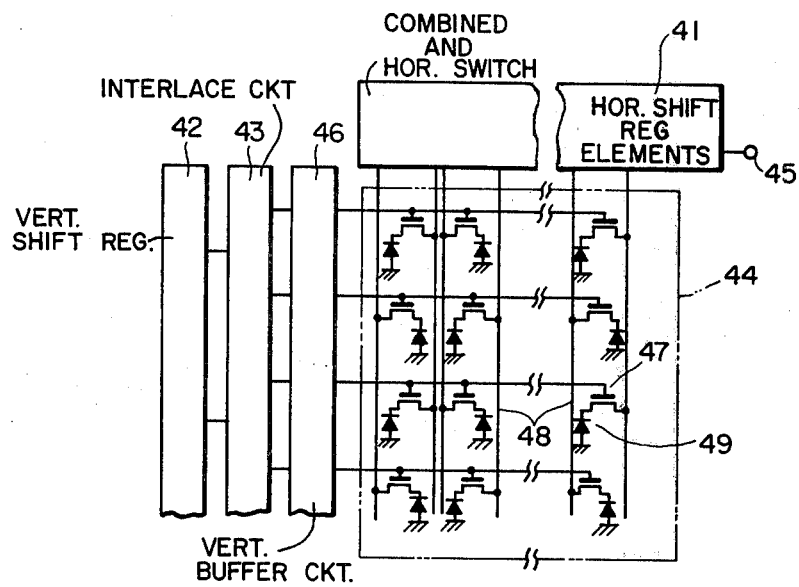
FIG. 3 is a circuit block diagram showing an embodiment of a solid-state imaging device of this invention.

FIG. 3 is a circuit block diagram showing an embodiment of a solid-state imaging device according to this invention.

In FIG. 3, numeral 41 designates a block into which a horizontal shift register and horizontal switching elements are combined, numeral 42 a vertical shift register, numeral 43 an interlace circuit, numeral 44 a photodiode array, numeral 45 an output terminal (a plurality of output terminals may well be disposed), numeral 46 a vertical buffer circuit, numeral 47 a photogate, numeral 48 a vertical signal output line, and numeral 49 a photodiode.

In the arrangement of FIG. 3, the vertical buffer circuit 46 raises an output pulse from the vertical register 42 having undergone a voltage drop by passing through the interlace circuit 43, up to a predetermined high level of a driving pulse for a vertical gate line again and recovers it enough to apply the highest voltage ($V_{DD}$) to the photogate 47. Thus, a photosensor of wide dynamic range is obtained.

Figure 4:
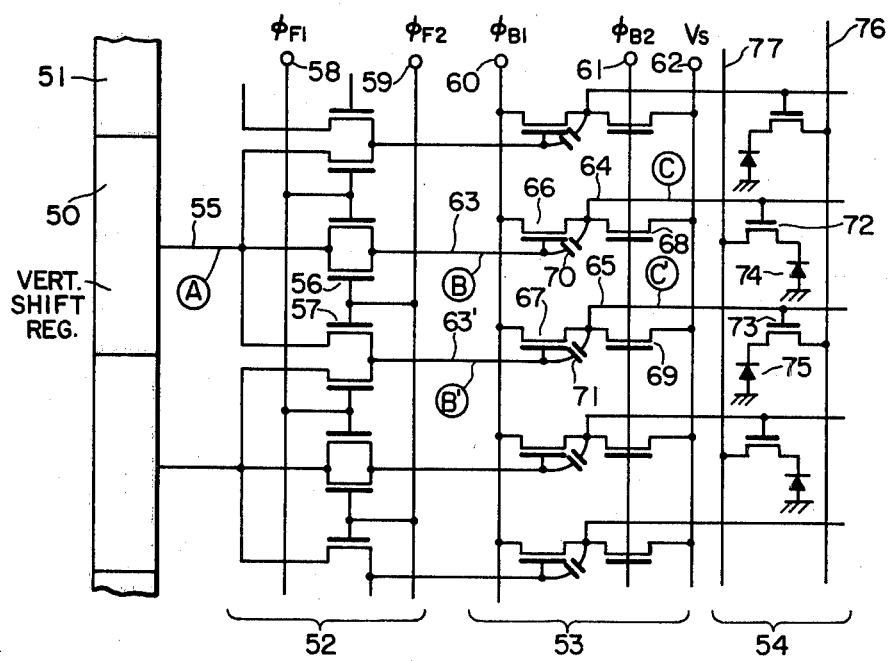
FIG. 4 is a schematic circuit diagram showing an example of an interlace circuit as well as a vertical buffer circuit in FIG. 3.
Figure 5:
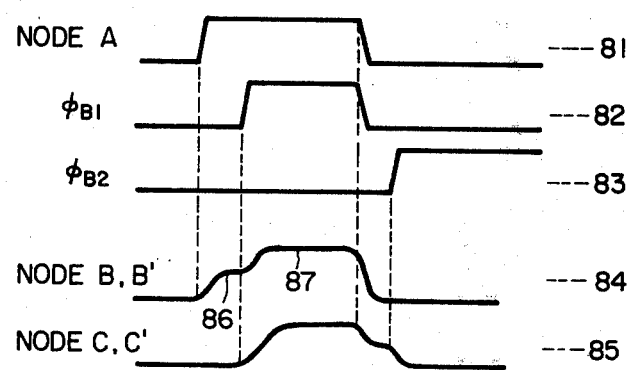
FIG. 5 is a pulse timing chart showing pulses at various nodes and vertical buffer circuit-control pulses $\phi_{B1}$ and $\phi_{B2}$ in FIG. 4.

FIG. 4 shows a concrete example of the vertical buffer circuit in FIG. 3. In FIG. 4, numeral 51 designates a unit circuit which constructs one stage of the vertical shift register 50, numeral 52 the interlace circuit, numeral 53 the vertical buffer circuit, and numeral 54 the photodiode array. FIG. 5 shows an example of an operating timing chart of the circuit arrangement in FIG. 4. Hereunder, the operating principle of the concrete embodiment of this invention shown in FIG. 4 will be described with reference to FIG. 5.

It is now supposed that in the arrangement of FIG. 4, the output pulse (voltage $V_{DD}$) from the vertical shift register is impressed on a node A of an output line 55 as shown at 81 in FIG. 5. Field pulses $\phi_{F1}$ and $\phi_{F2}$ are respectively applied to terminals 58 and 59, and the latter pulse $\phi_{F2}$ is assumed to be at a high level (supposed to be $V_{DD}$) and the former pulse $\phi_{F1}$ to be at a low level (in the converse case, the following situation holds similarly). At nodes B and B' of output lines indicated by numerals 63 and 63', voltages ($V_{DD}-V_T$) appear as shown at 86 in a waveform 84 of FIG. 5 ($V_T$ indicates the magnitude of the threshold voltages of MOSTs 56 and 57). Subsequently, a pulse $\phi_{B1}$ is impressed on a terminal 60 at a timing illustrated at 82 in FIG. 5. Then, as shown at 87 in FIG. 5, the voltages of the nodes B and B' become sufficiently higher than the voltage $V_{DD}$ owing to the bootstrap effect through the capacitances (parasitic capacitances or additional capacitances) 70 and 71 between the gates and sources of respective buffer MOSTs 66 and 67. In consequence, at nodes C and C' of vertical scanning lines (vertical gate lines) 64 and 65 connected to photogates 72 and 73 respectively, the high level $V_{DD}$ of the pulse $\phi_{B1}$ is applied as it is as illustrated at 85 in FIG. 5. In this way, the sufficiently high voltages $V_{DD}$ free from the threshold voltage drops are applied to the photogates 72 and 73, so that the dynamic range of the photosensor is ensured.

In the embodiment shown in FIGS. 4 and 5, a pulse $\phi_{B2}$ is impressed on a terminal 61 at a timing as illustrated at 83 in FIG. 5, whereby the voltages of the vertical gate lines 64 and 65 leading to the respective photogates 72 and 73 are lowered again. Owing to this method, even when the voltage of the low level of the pulse $\phi_{B1}$ is somewhat above 0 V, the voltages of the vertical gate lines leading to the photogates can be exactly brought down to a voltage $V_S$ (for example, 0 V) of a terminal 62. When the pulse $\phi_{B2}$ is kept at the high level during one horizontal scanning period, the photogate can be held at a low impedance, and a state immune to interfering noise can be established. Especially the former is greatly effective for preventing carriers from flowing as a tailing current underneath the photogate due to the overflow of the photodiode.

By repeating the cycles as stated above, signals of the picture elements are read out in succession.

As understood from the embodiments described above, this invention is applicable to any photosensor insofar as it is of the X-Y addressing type and it includes an interlace circuit and a vertical scanning circuit composed of MOSTs etc. For example, the horizontal scanning circuit of the block 41 in FIG. 3 is not restricted to a digital shift register which is composed of MOSTs, but it may well be composed of charge transfer devices (hereinbelow, abbreviated to "CTDs") which handle analog signals. In this case, the block 41 becomes a circuit which includes the CTDs and switching elements for transmitting signals from the vertical signal output lines 48 to the CTDs.

In FIG. 3, the MOS type photosensor having the array 44 of the p-n junction diodes has been exemplified. However, this is not restrictive, but CIDs (Charge Injection Devices; also of the X-Y addressing type) may be used as well.

The positions of the horizontal and vertical registers, etc. in FIG. 3 are not restricted to the upper and left parts. For example, the vertical circuits may well be disposed on the right side. The horizontal register may well be disposed on the lower side, or divided into upper and lower portions which are alternately used.

In the embodiments of this invention described above, a case where electrons are signal carriers (n-channel) is kept in mind. However, this is not restrictive, but the invention is quite similarly applicable to a case of employing holes as the signal carriers (p-channel) by, for example, inverting the polarities of the pulses and the conductivity types of regions of the MOSTs and the diodes.

As set forth above, according to this invention, a buffer circuit is disposed between an interlace circuit and vertical gate lines of a photosensor, thereby to realize a photosensor which can impress on photogates sufficiently high pulses free from threshold voltage drops, which has a wide dynamic range and which undergoes no degradation of a reproduced image even for a high contrast scene.

What is claimed is:

1. In a solid-state imaging device having enhanced dynamic range and including a plurality of photodiodes which are arrayed in two dimensions on an identical semiconductor body, a group of horizontal switching elements and a group of vertical switching elements for gating the signal output from the photodiodes, and a horizontal scanning circuit and a vertical scanning circuit which impress scanning pulses having a given voltage level on the horizontal and vertical switching elements respectively, and having an interlaced scanning mechanism for addressing a plurality of vertical scanning lines by means of interlace switching elements so as to permit horizontal scanning of scanning lines of a plurality of rows; said solid-state imaging device characterized in that said interlaced scanning mechanism includes means to restore said voltage level of the scanning pulses after said level has undergone a voltage drop due to said interlace switching elements.

2. A solid-state imaging device according to claim 1, wherein said interlaced scanning mechanism includes an interlace circuit which changes-over a combination of the vertical scanning lines to be addressed, by means of said interlace switching elements every field, and a vertical buffer circuit for restoring the voltage level of the scanning pulses having passed through said interlace circuit.

3. A solid-state imaging device according to claim 2, wherein said vertical buffer circuit includes insulated-gate field effect transistors for restoring voltage drops which are disposed at the respective vertical scanning lines, which receive output signals from said interlace circuit as their gate inputs and which are driven by driving pulses synchronous with output pulses of said vertical scanning circuit, and capacitances contributive to the bootstrap effect are existent between the gates and sources of said insulated-gate field effect transistors for restoring voltage drops.

4. A solid-state imaging device according to claim 2, wherein said interlace circuit includes first to fourth switching elements which consist of insulated-gate field effect transistors connected at outputs of respective stages of unit circuits constituting said vertical scanning circuit and which permit the simultaneous horizontal scanning of the scanning lines of two rows, first and second field pulses are respectively impressed on a set of said first and second switching elements and a set of said third and fourth switching elements, and said first and second switching elements are operated in a first field and said third and fourth switching elements in a second field by the use of output pulses provided from said vertical scanning circuit in time sequence and said field pulses, thereby to generate gate input pulses of said insulated-gate field effect transistors for restoring voltage drops.

5. A solid-state imaging device according to claim 2, wherein the sources (or drains) of said first to fourth switching elements ate connected to the outputs of the respective stages of said unit circuits constituting said vertical scanning circuit; the drain (or source) of said first switching element, the drains (or sources) of said second and third switching elements and the drain (or source) of said fourth switching element are respectively connected to the gates of the insulated-gate field effect transistors for restoring voltage drops, of the vertical scanning lines of a first row, second row and third row corresponding to the stages of said unit circuits; the field pulses are impressed on the gates of said first to fourth switching elements; the drains (or sources) of said insulated-gate field effect transistors for restoring voltage drops are connected to a first common line, on which driving pulses synchronous with output pulses provided from said vertical scanning circuit in time sequence are impressed; and the sources (or drains) of said insulated-gate field effect transistors for restoring voltage drops are connected to the respective vertical scanning lines.

6. A solid-state imaging device according to claim 5, wherein the drains (or sources) of insulated-gate field effect transistors for resetting whose gates are connected to a second common line and whose sources (or drains) are connected to a third common line are connected to the sources (or drains) of said insulated-gate field effect transistors for restoring voltage drops, a reset pulse is impressed on said second common line, and said third common line is grounded.

7. A solid-state imaging device according to claim 2, 3, 4, 5 or 6, wherein said vertical and horizontal switching elements are constructed of insulated-gate field effect transistors, and source junctions of said vertical switching elements are employed as said photodiodes.

* * * * *